United States Patent
Shin et al.

(10) Patent No.: US 10,192,901 B2
(45) Date of Patent: Jan. 29, 2019

(54) ORGANIC LIGHT EMITTING DIODE DISPLAY AND MANUFACTURING METHOD THEREOF

(71) Applicant: SAMSUNG DISPLAY CO., LTD., Yongin-si, Gyeonggi-Do (KR)

(72) Inventors: Young Ki Shin, Hwaseong-si (KR); Dae Ho Kim, Hwaseong-si (KR); Jong Chan Lee, Suwon-si (KR); Woong Hee Jeong, Seoul (KR); Yoon Ho Khang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/247,989

(22) Filed: Aug. 26, 2016

(65) Prior Publication Data

US 2017/0200742 A1    Jul. 13, 2017

(30) Foreign Application Priority Data

Jan. 8, 2016    (KR) .......................... 10-2016-0002663

(51) Int. Cl.
| | | |
|---|---|---|
| *H01L 29/786* | (2006.01) | |
| *H01L 27/12* | (2006.01) | |
| *H01L 27/32* | (2006.01) | |

(52) U.S. Cl.
CPC ........ *H01L 27/127* (2013.01); *H01L 27/1222* (2013.01); *H01L 29/78621* (2013.01);
(Continued)

(58) Field of Classification Search
CPC ......... H01L 29/78621; H01L 29/78675; H01L 29/78696
See application file for complete search history.

(56) References Cited

U.S. PATENT DOCUMENTS

2015/0087125 A1    3/2015   Nishio et al.
2017/0098718 A1 *  4/2017   Kim .................. H01L 21/26506

FOREIGN PATENT DOCUMENTS

| KR | 100529618 | 11/2005 |
| KR | 100546369 | 1/2006 |
| KR | 1020140053601 | 5/2014 |

OTHER PUBLICATIONS

Takashi Uchino, et al., "A Raised Source/Drain Technology Using In-situ P-doped SiGe and B-doped Si for 0.1-μm CMOS ULSIs", 1997 IEEE, IEDM 97-479-482.

(Continued)

*Primary Examiner* — Douglas Menz
(74) *Attorney, Agent, or Firm* — F. Chau & Associates, LLC

(57) ABSTRACT

An organic light emitting diode display having a lightly doped region formed in a transistor for simplifying manufacturing process and reducing manufacturing costs is provided. The organic light emitting diode display includes: a substrate, a transistor on the substrate, and an organic light emitting diode (OLED) connected to the transistor, wherein the transistor includes a semiconductor member on the substrate, an insulating member on the semiconductor member, a source member and a drain member disposed on the semiconductor member and respectively disposed at opposite sides of the insulating member, and a gate electrode on the insulating member, wherein each of the source member and the drain member includes a plurality of layers having different impurity doping concentrations.

20 Claims, 11 Drawing Sheets

(52) U.S. Cl.
CPC .. *H01L 29/78675* (2013.01); *H01L 29/78696* (2013.01); *H01L 27/3262* (2013.01); *H01L 2227/323* (2013.01)

(56) References Cited

OTHER PUBLICATIONS

A. Dixit, et al., "Minimization of Specific Contact Resistance in Multiple Gate NFETs by Selective Epitaxial Growth of Si in the HDD Regions", Solid State Electronics 50 (2006) 587-593.

\* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2016-0002663 filed in the Korean Intellectual Property Office on Jan. 8, 2016, the entire contents of which are incorporated by reference herein.

TECHNICAL FIELD

The present disclosure relates to an organic light emitting diode (OLED) display and a manufacturing method thereof.

DISCUSSION OF RELATED ART

An organic light emitting diode display includes an organic light emitting layer disposed between two electrodes. Electrons injected from a cathode electrode are combined with holes injected from an anode electrode in the organic light emitting layer to form excitons. The formed excitons discharge energy to emit light.

The organic light emitting diode display includes a plurality of pixels. Each pixel includes an organic light emitting diode made of a cathode, an anode, and an organic light emitting layer. A plurality of transistors and capacitors for driving the organic light emitting diode are also disposed in each pixel.

To obtain better reliability of a transistor by minimizing the leakage current, a lightly doped drain (LDD) may be formed in a semiconductor member of the transistor. However, to form the LDD requires a complicated manufacturing process. For example, it requires a separate mask, and also requires an annealing process and an activation process after ions are injected. The above complicate manufacturing process may require an additional manufacturing apparatus, and thus may cause the manufacturing costs to increase.

In general, the manufacturing cost of a high temperature process is higher than that of a low temperature process. Since the activation process is a high temperature process, the manufacturing cost is high. In addition, since it is difficult to apply a low heat resistant material to the high temperature process, the range of the material selection is narrow.

SUMMARY

An exemplary embodiment of the present disclosure provides an organic light emitting diode display and a manufacturing method thereof, in which a lightly doped region may be formed in a transistor without using a separate mask.

An organic light emitting diode display according to an exemplary embodiment of the present disclosure includes: a substrate; a transistor on the substrate; and an organic light emitting diode (OLED) connected to the transistor, in which the transistor includes a semiconductor member on the substrate, an insulating member on the semiconductor member, a source member and a drain member disposed on the semiconductor member and respectively disposed at opposite sides of the insulating member, and a gate electrode on the insulating member, in which each of the source member and the drain member includes a plurality of layers having different impurity doping concentrations.

The source member may include a plurality of first doped epitaxial layers and the drain member may include a plurality of second doped epitaxial layers.

The plurality of first doped epitaxial layers may include a first lightly doped epitaxial layer which contacts the semiconductor member and a first highly doped epitaxial layer disposed on the first lightly doped epitaxial layer, and the plurality of second doped epitaxial layers may include a second lightly doped epitaxial layer which contacts the semiconductor member and a second highly doped epitaxial layer disposed on the second lightly doped epitaxial layer.

The semiconductor member may include a polysilicon layer, and each of the plurality of first doped epitaxial layers and each of the plurality of second doped epitaxial layers may include a crystalline silicon layer which includes a doping impurity.

The insulating member may overlap the gate electrode.

A side boundary line of the insulating member may correspond to a side boundary line of the gate electrode.

The semiconductor member may include the first semiconductor region which overlaps the gate electrode and the second semiconductor region which does not overlap the gate electrode, and the source member and the drain member may overlap the second semiconductor region.

The semiconductor member may extend to overlap the transistor.

The organic light emitting diode display may further include a scan line disposed on the substrate and transmitting a scan signal, a data line and a driving voltage line which cross the scan line and transmit a data signal and a driving voltage, respectively, in which the transistor includes a switching transistor and a driving transistor, the switching transistor connected to the scan line and the data line, and the driving transistor connected to the switching transistor and including a driving gate electrode and a driving semiconductor member which overlaps the driving gate electrode and is curved in a plane view.

According to an exemplary embodiment of the present disclosure, a manufacturing method of an organic light emitting diode display includes: forming a transistor on a substrate; and forming an organic light emitting diode connected to the transistor, in which the forming of the transistor includes forming a semiconductor member on the substrate, sequentially forming an insulating layer covering the semiconductor member and a gate metal layer covering the insulation layer, forming a gate electrode and an insulating member by simultaneously etching the gate metal layer and the insulating layer, and forming a source member and a drain member on the semiconductor member, in which the source member and the drain member are disposed at opposite sides of the insulating member, and each includes a plurality of layers having different impurity doping concentrations.

The forming of the source member and the drain member may include forming a first lightly doped epitaxial layer and a second lightly doped epitaxial layer on the semiconductor member, and forming a first highly doped epitaxial layer and a second highly doped epitaxial layer on the first lightly doped epitaxial layer and the second lightly doped epitaxial layer, respectively.

The forming of the first lightly doped epitaxial layer and the second lightly doped epitaxial layer may include depositing a hydrogen radical including a doping impurity on the semiconductor member.

The forming of the first highly doped epitaxial layer and the second highly doped epitaxial layer may include depositing a hydrogen radical including a doping impurity having a doping concentration larger than a doping concentration of the first lightly doped epitaxial layer and the second lightly doped epitaxial layer on the first lightly doped epitaxial layer and the second lightly doped epitaxial layer.

The doping concentration of the first lightly doped epitaxial layer and the second lightly doped epitaxial layer may be in a range of about $10^{12}/cm^3$ to about $10^{15}/cm^3$.

The doping concentration of the first highly doped epitaxial layer and the second highly doped epitaxial layer may be larger than $10^{14}/cm^3$.

Before the forming of the semiconductor member on the substrate, the manufacturing method may further include forming a buffer layer on the substrate, the buffer layer may include a single silicon nitride layer or a dual layer with a silicon nitride layer over a silicon oxide layer.

According to an exemplary embodiment of the present disclosure, a manufacturing method of an organic light emitting diode (OLED) display includes: forming a plurality of transistors, and a capacitor connected to at least one of the plurality of transistors on a substrate; and forming an organic light emitting diode connected to at least one of the plurality of transistors, in which the forming of the plurality of transistors, at least forming one of the plurality of transistors includes: forming a buffer layer on the substrate, forming a semiconductor member on the buffer layer, forming an insulating layer covering the semiconductor member and a gate metal layer covering the insulating layer, forming a gate electrode and an insulating member by simultaneously etching the gate metal layer and the insulating layer, and forming a source member and a drain member through a selective epitaxial growth process on the semiconductor member at opposite sides of the insulating member, in which the source member and the drain member each includes a plurality of layers having different impurity doping concentrations.

The selective epitaxial growth process may include a first selective epitaxial growth process and a second selective epitaxial growth process, and the forming of the source member and the drain member may include: forming a first lightly doped epitaxial layer and a second lightly doped epitaxial layer through the first selective epitaxial growth process on the semiconductor member; and forming a first highly doped epitaxial layer and a second highly doped epitaxial layer through the second selective epitaxial growth process on the first lightly doped epitaxial layer and the second lightly doped epitaxial layer, respectively, in which the source member includes the first lightly and the first highly doped epitaxial layers, and the drain member includes the second lightly and the second highly doped epitaxial layers.

The first selective epitaxial growth process may include depositing silicon, hydrogen radical and a doping impurity on the semiconductor member to form the first lightly doped epitaxial layer and the second lightly doped epitaxial layer having a first doping concentration, and the second selective epitaxial growth process may include depositing silicon, hydrogen radical and the doping impurity to form the first highly doped epitaxial layer and the second highly doped epitaxial layer having a second doping concentration which is larger than the first doping concentration on the first lightly doped epitaxial layer and the second lightly doped epitaxial layer, respectively.

The first doping concentration may be in a range of about $10^{12}/cm^3$ to about $10^{15}/cm^3$, and the second doping concentration may be larger than $10^{14}/cm^3$.

According to an exemplary embodiment of the present disclosure, a lightly doped region may be formed in a transistor without using a separate mask, thereby simplifying a manufacturing process and reducing manufacturing costs.

Since a lightly doped epitaxial layer and a highly doped epitaxial layer, which have different doping concentrations, are formed by using a selective epitaxial growth process, the highly doped epitaxial layer may function as a source electrode and a drain electrode, and the lightly doped epitaxial layer may function as the lightly doped region. In addition, since the highly doped epitaxial layer functions as the source electrode and the drain electrode, a better contact characteristic of a transistor may be obtained.

One photo-process, two ion implantation processes and two activation processes for forming the lightly doped region may be omitted, thereby enhancing process ability by simplifying the manufacturing process and reducing a tact time. In addition, since it is possible to omit the activation process performed at a high temperature process, a low temperature process may allow the selection of a wide range of low heat resistant organic materials. Furthermore, since it is possible to use low temperature process, a low-priced glass substrate may be used, thereby reducing manufacturing costs and making it possible to use a low resistance wiring.

Figure 1:
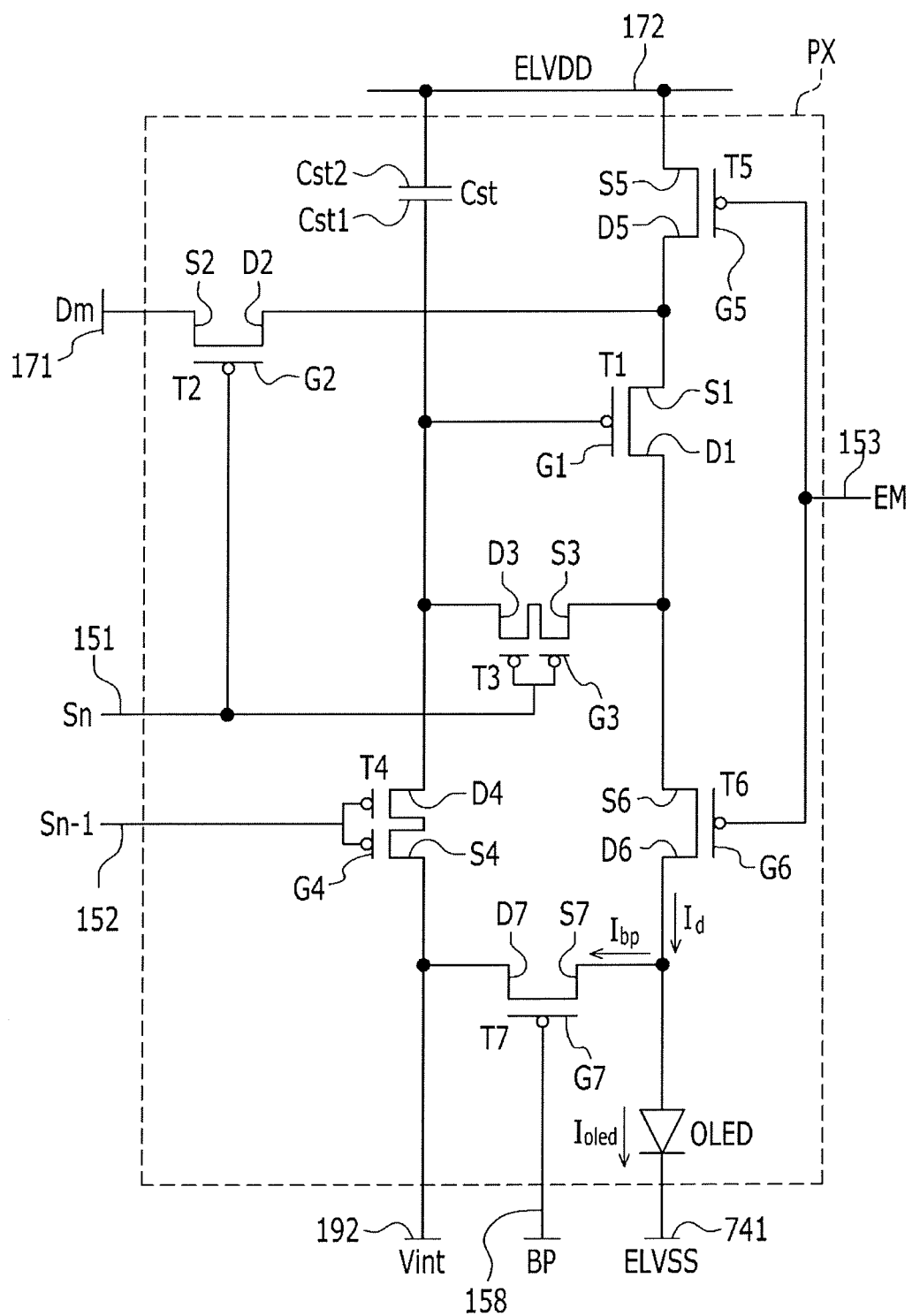
FIG. 1 is an equivalent circuit diagram of a pixel of an organic light emitting diode display according to an exemplary embodiment of the present disclosure.

Since the drawings in FIGS. 1-11 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present disclosure will be described more fully hereinafter with reference to the accompanying drawings, in which exemplary embodiments of the present disclosure are shown.

As those skilled in the art would realize, the described embodiments may be modified in various different ways, all without departing from the spirit or scope of the present disclosure.

To clearly describe the present disclosure, portions that are not connected with the description will be omitted. Like reference numerals designate like elements throughout the specification. In addition, in the drawings, size and thickness of each element are randomly represented for better understanding and ease of description, and the present disclosure is not limited thereto.

Unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. In addition, in the specification, the word "on" means positioning on or below the object portion, but does not necessarily mean positioning on the upper side of the object portion based on a gravitational direction.

It will be understood that, although the terms "first", "second", "third", "fourth" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept. As used herein, the singular forms "a", "an" and "the" are intended to include the plural forms as well, unless the context clearly indicates otherwise.

The present disclosure is not limited to the number of transistors and capacitors illustrated in the accompanying drawings. In the organic light emitting diode display, each pixel may be provided with a plurality of transistors and at least one capacitor, and may be formed to have various structures by further forming additional wires or omitting existing wires. In this case, a pixel means a minimum unit which displays an image, and the organic light emitting device displays an image through a plurality of pixels.

Throughout the specification, the term "a plane view" means a case where a target portion is viewed from the above, and the term "a cross-sectional view" means a case where a cross-section taken by vertically cutting a target portion is viewed from the side.

Hereinafter, an organic light emitting diode display according to an exemplary embodiment of the present disclosure will be described with reference to the accompanying drawings.

FIG. 1 is an equivalent circuit diagram of a pixel of an organic light emitting diode display according to an exemplary embodiment of the present disclosure.

As shown in FIG. 1, the organic light emitting diode display according to an exemplary embodiment of the present disclosure includes a plurality of signal lines 151, 152, 153, 158, 171, 172, and 192, and a plurality of pixels PX arranged in a matrix and connected to the plurality of signal lines.

A plurality of transistors T1, T2, T3, T4, T5, T6, and T7, a storage capacitor Cst, and an organic light emitting diode OLED are included in one pixel, and are connected to the plurality of signal lines 151, 152, 153, 158, 171, 172, and 192.

The plurality of transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151, a previous scan line 152, a light emission control line 153, a bypass control line 158, a data line 171, a driving voltage line 172, and an initialization voltage line 192.

The scan line 151 may transmit a scan signal Sn, the previous scan line 152 may transmit a previous scan signal Sn−1 to the initialization transistor T4, the light emission control line 153 may transmit a light emission control signal EM to the operation control transistor T5 and the light emission control transistor T6, and the bypass control line 158 may transmit a bypass signal BP to the bypass transistor T7.

The data line 171 may transmit a data signal Dm, the driving voltage line 172 may be substantially parallel to the data line 171 and may transmit a driving voltage ELVDD, and the initialization voltage line 192 may transmit an initialization voltage Vint initializing the driving transistor T1.

Each of the scan line 151, the previous scan line 152, the light emission control line 153, the bypass control line 158, the data line 171, the driving voltage line 172, and the initialization voltage line 192 may be connected to one pixel PX.

A gate electrode G1 of the driving transistor T1 may be connected to one end Cst1 of the storage capacitor Cst, a source electrode S1 of the driving transistor T1 may be connected to the driving voltage line 172 via the operation control transistor T5, and a drain electrode D1 of the driving transistor T1 may be electrically connected to an anode of the organic light emitting diode OLED via the light emission control transistor T6.

The driving transistor T1 may receive the data signal Dm according to a switching operation of the switching transistor T2 to supply a driving current Id to the organic light emitting diode OLED.

A gate electrode G2 of the switching transistor T2 may be connected to the scan line 151, a source electrode S2 of the switching transistor T2 may be connected to the data line 171, and a drain electrode D2 of the switching transistor T2 may be connected to the source electrode S1 of the driving transistor T1 and to the driving voltage line 172 via the operation control transistor T5.

The switching transistor T2 may perform a switching operation, so as to be turned on according to the scan signal Sn received through the scan line 151, to transmit the data signal Dm transmitted to the data line 171 to the source electrode S1 of the driving transistor T1.

A gate electrode G3 of the compensation transistor T3 may be directly connected to the scan line 151, a source electrode S3 of the compensation transistor T3 may be connected to the drain electrode D1 of the driving transistor T1 and to an anode of the organic light emitting diode OLED via the light emission control transistor T6, and a drain electrode D3 of the compensation transistor T3 may be connected to one end Cst1 of the storage capacitor Cst and the drain electrode D4 of the initialization transistor T4, together with the gate electrode G1 of the driving transistor T1.

The compensation transistor T3 may be turned on according to the scan signal Sn received through the scan line 151 to connect the gate electrode G1 and the drain electrode D1 of the driving transistor T1 and to diode-connect the driving transistor T1.

A gate electrode G4 of the initialization transistor T4 may be connected to the previous scan line 152, a source electrode S4 of the initialization transistor T4 may be connected to an initialization voltage line 192, and a drain electrode D4 of the initialization transistor T4 may be connected to both one end Cst1 of the storage capacitor Cst and the gate electrode G1 of the driving transistor T1 via the drain electrode D3 of the compensation transistor T3. The initialization transistor T4 may perform an initialization operation, so as to be turned on according to the previous scan signal Sn−1 received through the previous scan line 152, to transmit the initialization voltage Vint to the gate electrode G1 of the driving transistor T1 and then to initialize a gate voltage of the gate electrode G1 of the driving transistor T1. In this case, the compensation transistor T3 and the initialization transistor T4 are each configured to have a dual gate structure to cut off a leakage current.

A gate electrode G5 of the operation control transistor T5 may be connected to the light emission control line 153, a source electrode S5 of the operation control transistor T5 may be connected to the driving voltage line 172, and a drain electrode D5 of the operation control transistor T5 may be connected to the source electrode S1 of the driving transistor T1 and the drain electrode D2 of the switching transistor T2.

A gate electrode G6 of the light emission control transistor T6 may be connected to the light emission control line 153, the source electrode S6 of the light emission control transistor T6 may be connected to the drain electrode D1 of the driving transistor T1 and the source electrode S3 of the compensation transistor T3, and the drain electrode D6 of the light emission control transistor T6 may be electrically connected to the anode of the organic light emitting diode OLED.

The operation control transistor T5 and the light emission control transistor T6 may be simultaneously turned on according to the light emission control signal EM transmitted to the light emission control line 153, such that the driving voltage ELVDD is compensated by using the diode-connected driving transistor T1 and is transmitted to the organic light emitting diode OLED.

A gate electrode G7 of the bypass transistor T7 may be connected to the bypass control line 158, a source electrode S7 of the bypass transistor T7 may be connected to both the drain electrode D6 of the light emission control transistor T6 and the anode of the organic light emitting diode OLED, and a drain electrode D7 of the bypass transistor T7 may be connected to both the initialization voltage line 192 and the source electrode S4 of the initialization transistor T4.

The other end Cst2 of the storage capacitor Cst may be connected to the driving voltage line 172 transmitting the driving voltage ELVDD, and a cathode of the organic light emitting diode OLED may be connected to a common voltage line 741 transmitting a common voltage ELVSS.

The seven-transistor and one-capacitor structure is illustrated in the exemplary embodiment of the present disclosure above, but the present disclosure is not limited thereto, and the number of transistors and the number of capacitors may be variously changed.

A detailed structure of the organic light emitting diode display shown in FIG. 1 will be described in detail with reference to FIGS. 2, 3, 4, and 5.

Figure 2:
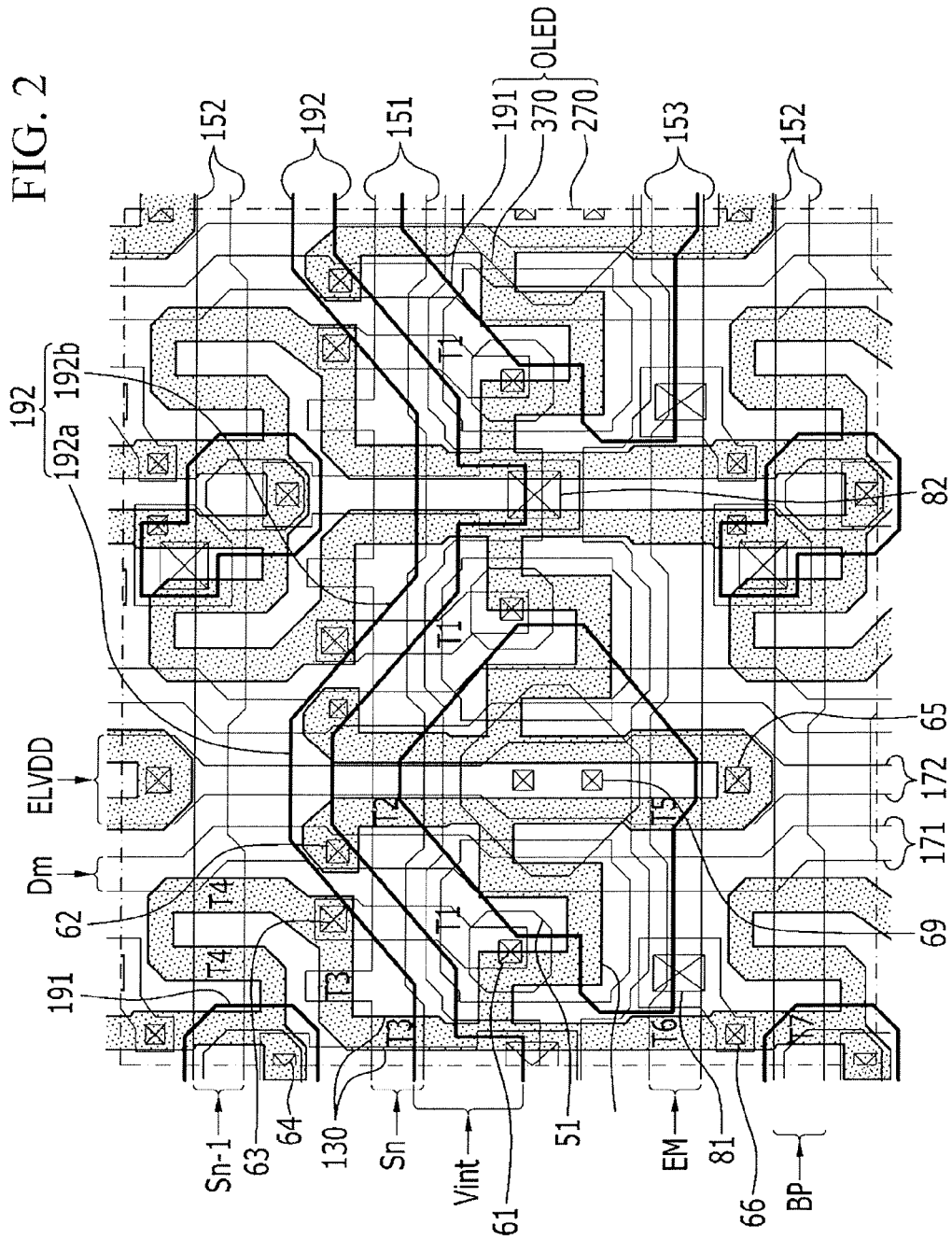
FIG. 2 is a schematic layout view of a plurality of transistors and a capacitor of an organic light emitting diode display according to an exemplary embodiment of the present disclosure.
Figure 3:
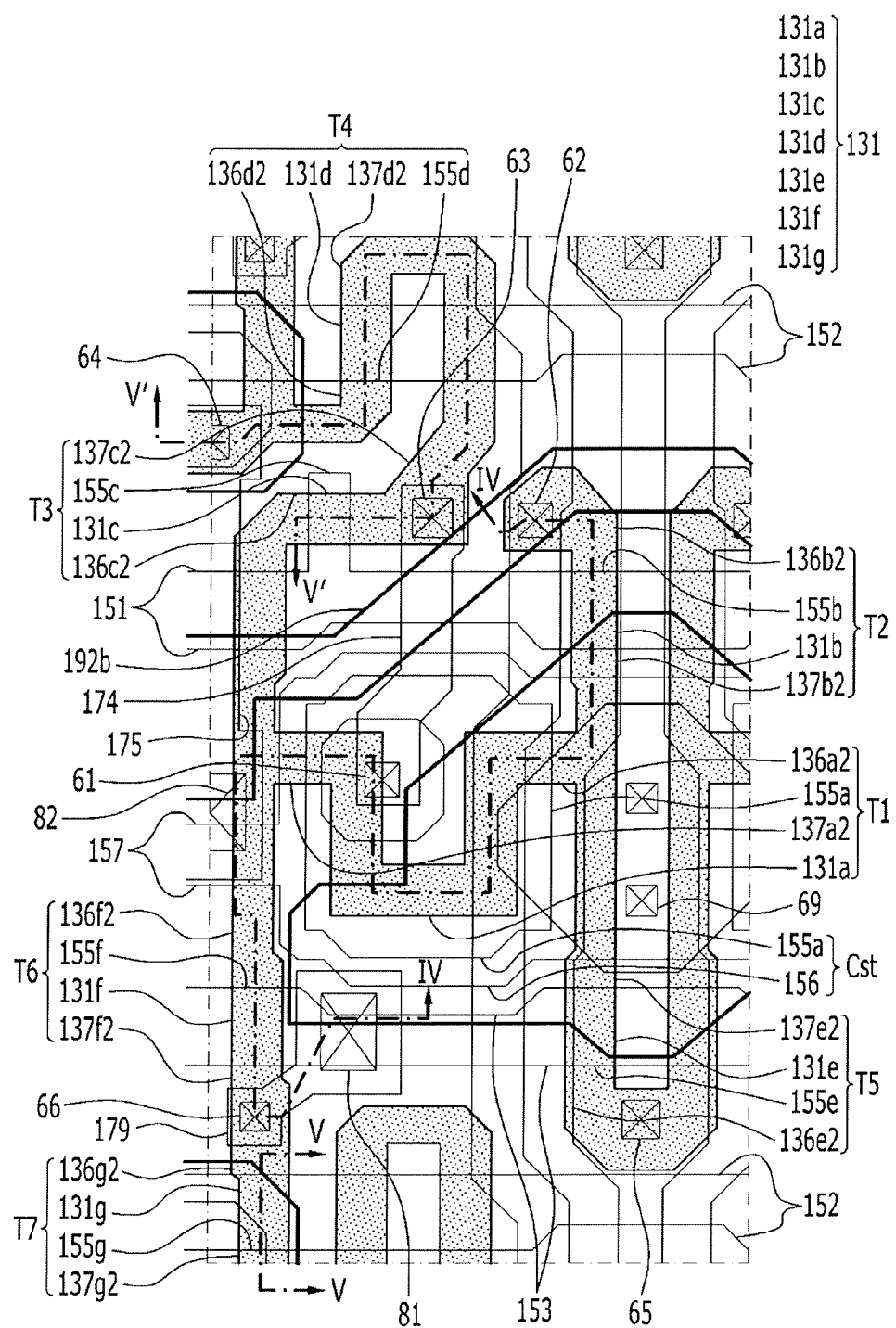
FIG. 3 is a detailed layout view of FIG. 2.
Figure 4:
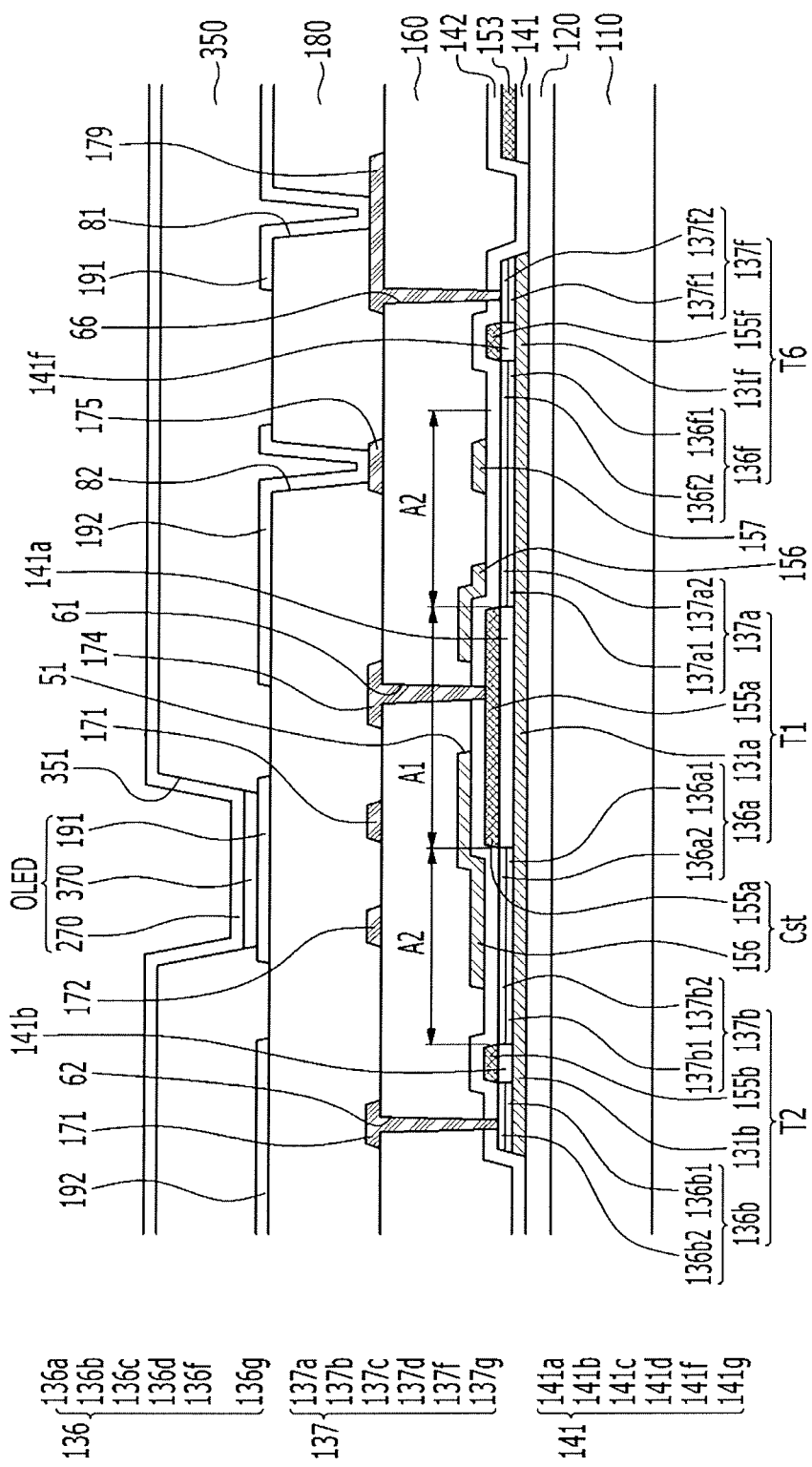
FIG. 4 is a cross-sectional view of the organic light emitting diode display of FIG. 3 taken along line IV-IV.
Figure 5:
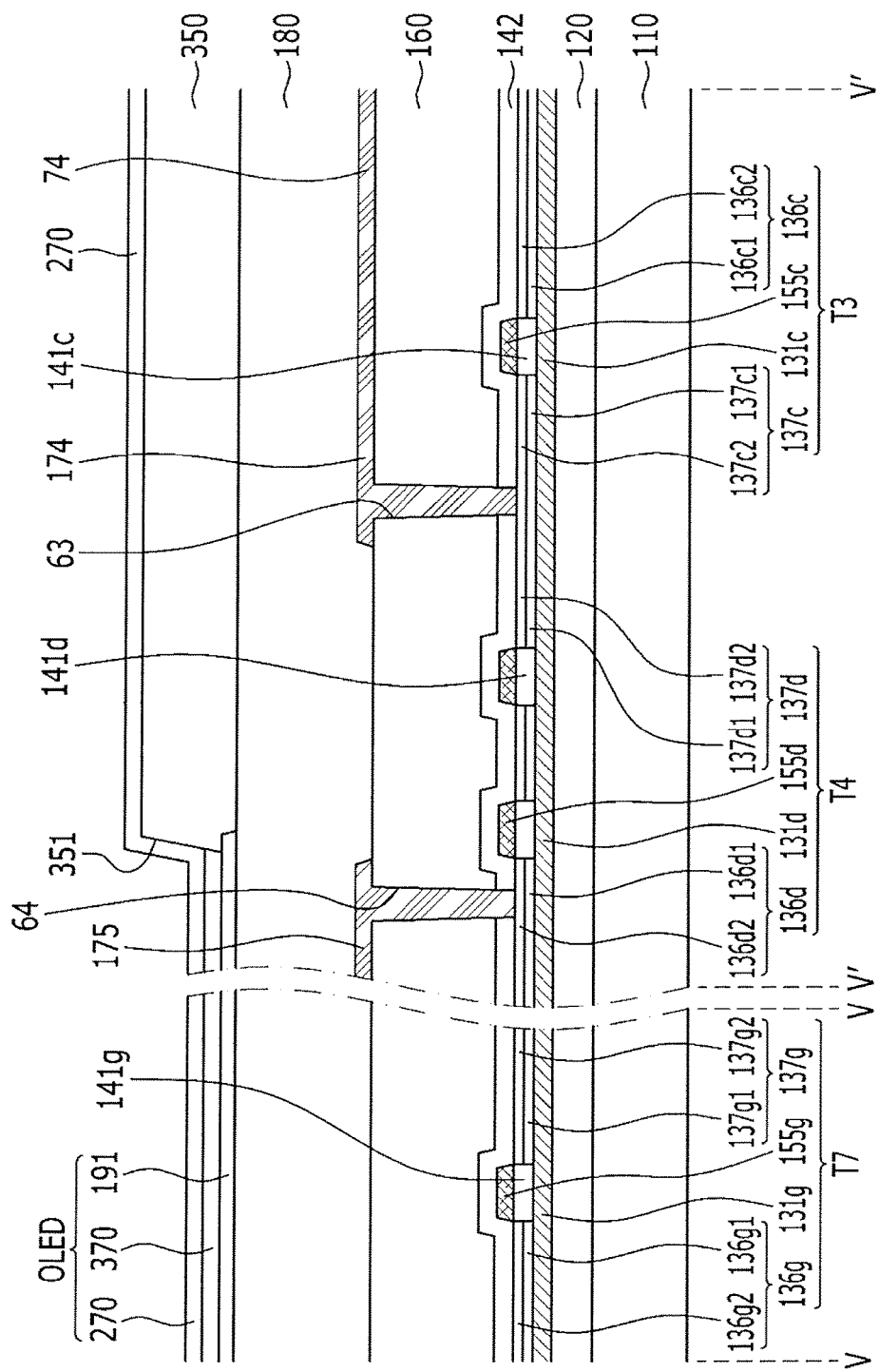
FIG. 5 is a cross-sectional view of the organic light emitting diode display of FIG. 3 taken along lines V-V and V'-V'.

FIG. 2 is a schematic layout view of a plurality of transistors and a capacitor of an organic light emitting diode display according to an exemplary embodiment of the present disclosure, FIG. 3 is a detailed layout view of FIG. 2, FIG. 4 is a cross-sectional view of the organic light emitting diode display of FIG. 3 taken along line IV-IV, and FIG. 5 is a cross-sectional view of the organic light emitting diode display of FIG. 3 taken along lines V-V and V'-V'.

As shown in FIGS. 2 and 3, the organic light emitting diode display according to an exemplary embodiment of the present disclosure may include the scan line 151, the previous scan line 152, and the light emission control line 153, which respectively transmit the scan signal Sn, the previous scan signal Sn−1, and the light emission control signal EM, and which are disposed in a row direction.

Since the bypass control signal BP is substantially the same as the previous scan signal Sn−1, a separate bypass control line is not disposed and the bypass control signal BP is transmitted through the previous scan line 152.

The data line 171 and the driving voltage line 172 crossing the scan line 151, the previous scan line 152, and the light emission control line 153, respectively transmitting the data signal Dm and the driving voltage ELVDD to the pixel PX, may be further included.

The initialization voltage Vint may be transmitted from the initialization voltage line 192 via the initialization transistor T4 to the compensation transistor T3.

The initialization voltage line 192 may alternately have a straight portion 192a and an oblique portion 192b.

The straight portion 192a may be disposed to be parallel to the scan line 151, and the oblique portion 192b may extend at a predetermined angle with the straight portion 192a.

The pixel PX may be provided with the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLED.

The organic light emitting diode OLD may include a pixel electrode 191, an organic emission layer 370, and a common electrode 270.

As shown in FIG. 2, a semiconductor member 130 may be curved in various shapes.

The driving transistor T1, the switching transistor T2, the compensation transistor T3, the initialization transistor T4, the operation control transistor T5, the light emission control transistor T6, and the bypass transistor T7 may be disposed along the semiconductor member 130. The semiconductor member 130 extends to overlap these transistors. Different portions of the semiconductor member 130 are included in different transistors. For example, the portion of the semiconductor member 130 overlapping the driving transistor T1 and included in the driving transistor T1 may be referred to as driving semiconductor member. Similarly, the portion of the semiconductor member 130 overlapping the switching transistor T2 and included in the switching transistor T2 may be referred to as switching semiconductor member.

Several portions of the semiconductor member 130 may correspond to the channels 131 of the transistors T1, T2, T3, T4, T5, T6, and T7.

The semiconductor member 130 may include a polysilicon layer which is doped with an N-type impurity or a P-type impurity.

As shown in FIGS. 4 and 5, a source member 136 and a drain member 137 are disposed on the channel 131, which is one portion of the semiconductor member 130.

The source member 136 may include a plurality of first doped epitaxial layers 136a, 136b, 136c, 136d, 136f, and 136g, and the drain member 137 may include a plurality of second doped epitaxial layers 137a, 137b, 137c, 137d, 137f, and 137g.

A doping concentration of the source member 136 and the drain member 137 may be higher than a doping concentration of the channel 131.

As the source member 136 and the drain member 137, which are disposed on the semiconductor member 130, are disposed between adjacent transistors, the adjacent transistors may be electrically connected to each other.

The plurality of first doped epitaxial layers 136a, 136b, 136c, 136d, 136f, and 136g may include first lightly doped epitaxial layers 136a1, 136b1, 136c1, 136d1, 136f1, and 136g1 which contact the channel 131, and first highly doped epitaxial layers 136a2, 136b2, 136c2, 136d2, 136f2, and 136g2 disposed on the first lightly doped epitaxial layers 136a1, 136b1, 136c1, 136d1, 136f1, and 136g1.

Further, the plurality of second doped epitaxial layers 137a, 137b, 137c, 137d, 137f, and 137g may include second lightly doped epitaxial layers 137a1, 137b1, 137c1, 137d1, 137f1, and 137g1 which contact the channel 131, and second highly doped epitaxial layers 137a2, 137b2, 137c2, 137d2, 137f2, and 137g2 disposed on the second lightly doped epitaxial layers 137a1, 137b1, 137c1, 137d1, 137f1, and 137g1.

As shown in FIG. 3, FIG. 4, and FIG. 5, the channel 131 may include a driving channel 131a disposed in the driving transistor T1, a switching channel 131b disposed in the switching transistor T2, a compensation channel 131c disposed in the compensation transistor T3, an initialization channel 131d disposed in the initialization transistor T4, an operation control channel 131e disposed in the operation control transistor T5, a light emission control channel 131f disposed in the light emission control transistor T6, and a bypass channel 131g disposed in the bypass transistor T7.

The driving transistor T1 may include the driving channel 131a, a driving gate electrode 155a, a driving source electrode 136a2, and a driving drain electrode 137a2.

The driving channel 131a may be curved, and may have a meandering shape or a zigzag shape. The driving semiconductor member includes or corresponds to the driving channel 131a. Thus, the driving semiconductor member may also be curved, and may also have a meandering shape or a zigzag shape. As such, by forming the curved driving channel 131a, the driving channel 131a may be formed to extend in a narrow space.

The driving gate electrode 155a may overlap one portion of the driving channel 131a, and the driving source electrode 136a2 and the driving drain electrode 137a2 may be disposed on the driving channel 131a and disposed to be adjacent to opposite sides of the driving gate electrode 155a.

In an exemplary embodiment of the present disclosure, the driving source electrode 136a2 may correspond to one portion of the first highly doped epitaxial layer 136a2, and the driving drain electrode 137a2 may correspond to one portion of the second highly doped epitaxial layer 137a2.

The first lightly doped epitaxial layer 136a1 may be disposed between the driving channel 131a and the driving source electrode 136a2, and the second lightly doped epitaxial layer 137a1 may be disposed between the driving channel 131a and the driving drain electrode 137a2.

The first lightly doped epitaxial layer 136a1 and the second lightly doped epitaxial layer 137a1 may be crystalline silicon layers which are lightly impurity doped. The first highly doped epitaxial layer 136a2 and the second highly doped epitaxial layer 137a2 may be crystalline silicon layers which are highly impurity doped and may have doping concentrations higher than doping concentrations of the first lightly doped epitaxial layer 136a1 and the second lightly doped epitaxial layer 137a1.

The first lightly doped epitaxial layer 136a1 and the second lightly doped epitaxial layer 137a1 may function as a lightly doped drain LDD which enhances reliability of a transistor and minimizes a leakage current.

The first lightly doped epitaxial layer 136a1 and the second lightly doped epitaxial layer 137a1, which function as the LDD, may be formed through a selective epitaxial growth process without using a separate mask, thereby simplifying a manufacturing process and reducing manufacturing costs.

In the selective epitaxial growth process, the substrate containing the semiconductor member 130 and the gate electrodes is placed in a reaction chamber, then a source gas is supplied into the reaction chamber. The source gas for depositing silicon may include, for example, $SiCl_4$, $SiF_4$, $SiH_2Cl_2$, $SiHCl_3$, $SiH_4$ or $Si_2H_6$. For depositing germanium, silicon germanium, or other semiconductor, other source gas may be used. The source gas for depositing silicon supplied inside the reaction chamber is absorbed on the surface of the exposed semiconductor member 130, and the silicon epitaxial layer is then selectively formed on the exposed semiconductor member 130. The selectivity promoting gas including, for example, $H_2$, HCl, or $Cl_2$, is also supplied to the reaction chamber to prevent undesirable nucleus generation of semiconductor material.

For forming a doped epitaxial layer, gas of a doping impurity or gases of multiple doping impurities may be supplied to the reaction chamber with a predetermined gas ratio to the silicon source gas for obtaining a doped epitaxial silicon layer with a desired doping concentration. The doped epitaxial silicon layer may include a dopant such as, for example, carbon, germanium, phosphorus, arsenic or boron. For forming phosphorus doped epitaxial silicon layer, the gas of doping impurity may be $PH_3$ gas.

The driving gate electrode 155a may be connected to a driving connecting member 174 through a contact hole 61.

The switching transistor T2 may include the switching channel 131b, a switching gate electrode 155b, a switching source electrode 136b2, and a switching drain electrode 137b2.

The switching gate electrode 155b, which is one portion of the scan line 151, may overlap one portion of the switching channel 131b. The switching source electrode 136b2 and the switching drain electrode 137b2 may be disposed on the switching channel 131b and disposed to be adjacent to opposite sides of the switching gate electrode 155b.

The switching source electrode 136b2 may correspond to one portion of the first highly doped epitaxial layer 136b2, and the switching drain electrode 137b2 may correspond to one portion of the second highly doped epitaxial layer 137b2.

The first lightly doped epitaxial layer 136b1 may be disposed between the switching channel 131b and the switching source electrode 136b2, and the second lightly doped epitaxial layer 137b1 may be disposed between the switching channel 131b and the switching drain electrode 137b2.

The first lightly doped epitaxial layer 136b1 and the second lightly doped epitaxial layer 137b1 may be crystalline silicon layers which are lightly impurity doped. The first highly doped epitaxial layer 136b2 and the second highly doped epitaxial layer 137b2 may be crystalline silicon layers which are highly impurity doped and may have doping concentrations higher than doping concentrations of the first lightly doped epitaxial layer 136b1 and the second lightly doped epitaxial layer 137b1.

The first lightly doped epitaxial layer 136b1 and the second lightly doped epitaxial layer 137b1 may function as a lightly doped drain LDD which enhances reliability of a transistor and minimizes a leakage current.

The switching source electrode 136b2 may be connected to the data line 171 through a contact hole 62.

The compensation transistor T3 may include the compensation channel 131c, a compensation gate electrode 155c, a compensation source electrode 136c2, and a compensation drain electrode 137c2.

The compensation gate electrode 155c, which is another area of the scan line 151, may be formed as two to prevent current leakage, and it may overlap one portion of the compensation channel 131c.

The compensation source electrode 136c2 and the compensation drain electrode 137c2 may be disposed on the compensation channel 131c and disposed to be adjacent to opposite sides of the compensation gate electrode 155c.

The compensation source electrode 136c2 may correspond to one portion of the first highly doped epitaxial layer 136c2, and the compensation drain electrode 137c2 may correspond to one portion of the second highly doped epitaxial layer 137c2.

The first lightly doped epitaxial layer 136c1 may be disposed between the compensation channel 131c and the compensation source electrode 136c2, and the second lightly doped epitaxial layer 137c1 may be disposed between the compensation channel 131c and the compensation drain electrode 137c2.

The compensation drain electrode 137c2 may be connected to the driving connecting member 174 through a contact hole 63.

The initialization transistor T4 may include the initialization channel 131d, an initialization gate electrode 155d, an initialization source electrode 136d, and an initialization drain electrode 137d.

The initialization gate electrode 155d, which is one portion of the previous scan line 152, may be formed as two to prevent current leakage, and it may overlap one portion of the initialization channel 131d.

The initialization source electrode 136d2 and the initialization drain electrode 137d2 may be disposed on the initialization channel 131d and disposed to be adjacent to opposite sides of the initialization gate electrode 155d.

The initialization source electrode 136d2 may correspond to one portion of the first highly doped epitaxial layer 136d2, and the initialization drain electrode 137d2 may correspond to one portion of the second highly doped epitaxial layer 137d2.

The first lightly doped epitaxial layer 136d1 may be disposed between the initialization channel 131d and the initialization source electrode 136d2, and the second lightly doped epitaxial layer 137d1 may be disposed between the initialization channel 131c1 and the initialization drain electrode 137d2.

The initialization source electrode 136d2 may be connected to the initialization connecting member 175 through a contact hole 64.

The operation control transistor T5 may include the operation control channel 131e, an operation control gate electrode 155e, an operation control source electrode 136e2, and an operation control drain electrode 137e2.

The operation control gate electrode 155e, which is one portion of the light emission control line 153, may overlap one portion of the operation control channel 131e. The operation control source electrode 136e2 and the operation control drain electrode 137e2 may be disposed on the operation control channel 131e and disposed to be adjacent to opposite sides of the operation control gate electrode 155e.

The operation control source electrode 136e2 may be connected to an area of the driving voltage line 172 through a contact hole 65.

The light emission control transistor T6 may include the light emission control channel 131f, a light emission control gate electrode 155f, a light emission control source electrode 136f2, and a light emission control drain electrode 137f2.

The light emission control gate electrode 155f, which is one portion of the light emission control line 153, may overlap one portion of the light emission control channel 131f. The light emission control source electrode 136f2 and the light emission control drain electrode 137f2 may be disposed on the light emission control channel 131f and disposed to be adjacent to opposite sides of the light emission control gate electrode 155f.

The light emission control source electrode 136f2 may correspond to one portion of the first highly doped epitaxial layer 136f2, and the light emission control drain electrode 137f2 may correspond to one portion of the second highly doped epitaxial layer 137f2.

The first lightly doped epitaxial layer 136f1 may be disposed between the light emission control channel 131f and the light emission control source electrode 136f2, and the second lightly doped epitaxial layer 137f1 may be disposed between the light emission control channel 131f and the light emission control drain electrode 137f2.

The light emission control drain electrode 137f2 may be connected to a pixel connecting member 179 through a contact hole 66.

The bypass transistor T7 may include the bypass channel 131g, a bypass gate electrode 155g, a bypass source electrode 136g2, and a bypass drain electrode 137g2.

The bypass gate electrode 155g, which is one portion of the previous scan line 152, may overlap one portion of the bypass channel 131g. The bypass source electrode 136g2 and the bypass drain electrode 137g2 may be disposed on the bypass channel 131g and disposed to be adjacent to opposite sides of the bypass gate electrode 155g.

The bypass source electrode 136g2 may correspond to one portion of the first highly doped epitaxial layer 136g2, and the bypass drain electrode 137g2 may correspond to one portion of the second highly doped epitaxial layer 137g2.

The first lightly doped epitaxial layer 136g1 may be disposed between the bypass channel 131g and the bypass source electrode 136g2, and the second lightly doped epitaxial layer 137g1 may be disposed between the bypass channel 131g and the bypass drain electrode 137g2.

The bypass source electrode 136g2 may be connected directly to the light emission control drain electrode 137f2 and the bypass drain electrode 137g2 may be connected directly to the initialization source electrode 136d2.

The semiconductor member 130 may include a first semiconductor region A1 which overlaps the gate electrodes 155a, 155b, 155c, 155d, 155e, 155f, and 155g, and a second semiconductor region A2 which does not overlap the gate electrodes 155a, 155b, 155c, 155d, 155e, 155f, and 155g.

The source member 136 and the drain member 137 may overlap the second semiconductor region A2.

The capacitor Cst may include the first storage electrode 155a and a second storage electrode 156, with a second gate insulating layer 142 disposed therebetween.

The first storage electrode 155a may correspond to the driving gate electrode 155a. The second storage electrode 156 may be a portion expanding from a storage line 157. An area of the second storage electrode 156 may be larger than an area of the driving gate electrode 155a, and the second storage electrode 156 may cover the whole driving gate electrode 155a The second gate insulating layer 142 may include a dielectric material, and storage capacitance may be determined by a charge charged in the storage capacitor Cst and a voltage between both storage electrodes 155a and 156.

As described above, the driving gate electrode 155a may be used as the first storage electrode 155a, and thus a space for forming the storage capacitor may be secured in a space that is narrowed due to the driving channel 131a occupying a large area within the pixel.

The first storage electrode 155a, which is the driving gate electrode 155a, may be connected to one end of the driving connecting member 174 through a contact hole 61 and a storage opening 51.

The storage opening 51 may be a groove formed in the second storage electrode 156. Accordingly, the contact hole 61 connecting one end of the driving connecting member 174 to the driving gate electrode 155a may be disposed inside the storage opening 51.

The driving connecting member 174 may be nearly parallel to the data line 171 and may be disposed on the same layer as the data line 171, and the other end of the driving connecting member 174 may be connected to the compensation drain electrode 137c2 of the compensation transistor T3 and the initialization drain electrode 137d2 of the initialization transistor T4 through the contact hole 63. Accordingly, the driving connecting member 174 may connect the driving gate electrode 155a to the compensation drain electrode 137c2 of the compensation transistor T3 and the initialization drain electrode 137d2 of the initialization transistor T4.

The second storage electrode 156 may be connected to the driving voltage line 172 through a contact hole 69. Accordingly, the storage capacitor Cst may store the storage capacitance corresponding to a difference between the driving voltage ELVDD transmitted to the second storage electrode 156 through the driving voltage line 172 and a driving gate voltage Vg of the driving gate electrode 155a.

The pixel connecting member 179 may be connected to the pixel electrode 191 through a contact hole 81, and the initialization connecting member 175 may be connected to the initialization voltage line 192 through a contact hole 82.

Hereinafter, the cross-sectional structures of the organic light emitting diode display according to an exemplary embodiment of the present disclosure will be described in detail according to a stacking order with reference to FIGS. 4 and 5.

Since the stacked structures of the operation control transistor T5 are substantially the same as that of the light emission control transistor T6, a detailed description thereof will be omitted.

A buffer layer 120 may be disposed on a substrate 110.

The substrate 110 may be made of an insulating material such as, for example, glass, quartz, ceramic, or plastic. The buffer layer 120 may block impurities from the insulating substrate 110 during a crystallization process for forming polysilicon to obtain better characteristics of the polysilicon and to reduce stress applied to the substrate 110.

The semiconductor member 130 including the channel 131, which includes the driving channel 131a, the switching channel 131b, the compensation channel 131c, the initialization channel 131d, the operation control channel 131e, the light emission control channel 131f, and the bypass channel 131g, may be disposed on the buffer layer 120.

A first gate insulating layer 141 including an insulating member 140 may be disposed on the semiconductor member 130.

The insulating member 140 may include a driving insulating member 141a disposed on the driving channel 131a, a switching insulating member 141b disposed on the switching channel 131b, a compensation insulating member 141c disposed on the compensation channel 131c, an initialization insulating member 141d disposed on the initialization channel 131d, a light emission control insulating member 141f disposed on the light emission control channel 131f, and a bypass insulating member 141g disposed on the bypass channel 131g.

On the first gate insulating layer 141, first gate metal lines 151, 152, 153, and 155a, including the scan line 151, which includes the switching gate electrode 155b and the compensation gate electrode 155c, the previous scan line 152, which includes the initialization gate electrode 155d and the bypass gate electrode 155g, the light emission control line 153, which includes the light emission control gate electrode 155f, and the driving gate electrode (the first storage electrode) 155a may be disposed.

The driving gate electrode 155a may be disposed on the driving insulating member 141a, the switching gate electrode 155b may be disposed on the switching insulating member 141b, the compensation gate electrode 155c may be disposed on the compensation insulating member 141c, the initialization gate electrode 155d may be disposed on the initialization insulating member 141d, the light emission control gate electrode 155f may be disposed on the light emission control insulating member 141f, and the bypass gate electrode 155g may be disposed on the bypass insulating member 141g.

A side boundary line of the insulating members 141a, 141b, 141c, 141d, 141f, and 141g may correspond to a side boundary line of the gate electrodes 155a, 155b, 155c, 155d, 155f, and 155g. This is because the insulating members 141a, 141b, 141c, 141d, 141f, and 141g and the gate electrodes 155a, 155b, 155c, 155d, 155f, and 155g may be formed simultaneously in the same etching process.

The driving source electrode 136a2 and the driving drain electrode 137a2 may be disposed at opposite sides of the driving insulating member 141a, and the switching source electrode 136b2 and the switching drain electrode 137b2 may be disposed at opposite sides of the switching insulating member 141b.

The compensation source electrode 136c2 and the compensation drain electrode 137c2 may be disposed at opposite sides of the compensation insulating member 141c, and the initialization source electrode 136d2 and the initialization drain electrode 137d2 may be disposed at opposite sides of the initialization insulating member 141d.

The light emission control source electrode 136f2 and the light emission control drain electrode 137f2 may be disposed at opposite sides of the light emission control insulating member 141f, and the bypass source electrode 136g2 and the bypass drain electrode 137g2 may be disposed at opposite sides of the bypass insulating member 141g.

The first lightly doped epitaxial layers 136a1, 136b1, 136c1, 136d1, 136f1, and 136g1, which function as the lightly doped drain LDD, may be disposed between the driving channel 131a and the driving source electrode 136a2, between the switching channel 131b and the switching source electrode 136b2, between the compensation channel 131c and the compensation source electrode 136c2, between the initialization channel 131d and the initialization source electrode 136d2, between the light emission control channel 131f and the light emission control source electrode 136f2, and between the bypass channel 131g and the bypass source electrode 136g2, respectively.

The second lightly doped epitaxial layers 137a1, 137b1, 137c1, 137d1, 137f1, and 137g1, which function as the lightly doped drain LDD, may be disposed between the driving channel 131a and the driving drain electrode 137a2, between the switching channel 131b and the switching drain electrode 137b2, between the compensation channel 131c and the compensation drain electrode 137c2, between the initialization channel 131d and the initialization drain electrode 137d2, between the light emission control channel 131f and the light emission control drain electrode 137f2, and between the bypass channel 131g and the bypass drain electrode 137g2, respectively.

As described above, the first lightly doped epitaxial layers 136a1, 136b1, 136c1, 136d1, 136f1, and 136g1, and the second lightly doped epitaxial layers 137a1, 137b1, 137c1, 137d1, 137f1, and 137g1, which function as the lightly doped drain LDD, are formed, thereby mitigating unexpected fluctuations of an electric field of the driving drain electrode 137a2, the switching drain electrode 137b2, the compensation drain electrode 137c2, the initialization drain electrode 137d2, the light emission control drain electrode 137f2, and the bypass drain electrode 137g2, and minimizing a leakage current. Therefore, the reliability of transistors T1, T2, T3, T4, T6, and T7 can be enhanced.

The second gate insulating layer 142 covering the first gate metal lines 151, 152, 153, and 155a and the first gate insulating layer 141 is disposed thereon.

The first gate insulating layer 141 and second gate insulating layer 142 may be made of, for example, a silicon nitride (SiNx), a silicon oxide (SiOx), or the like.

The second gate metal lines 157 and 156 including a storage line 157 parallel with the scan line 151 and a second storage electrode 156, which is a portion extended from the storage line 157, are disposed on the second gate insulating layer 142.

As the second storage electrode 156 has a wider area than the first storage electrode 155a which functions as the driving gate electrode, the second storage electrode 156 may wholly cover the driving gate electrode 155a.

The gate metal lines 151, 152, 153, 155a, 156, and 157, which include the first gate metal lines 151, 152, 153, and 155a and the second gate metal lines 156 and 157, may be made of single layer made of any of copper (Cu), a copper alloy, aluminum (Al), an aluminum alloy, titanium (Ti), a titanium alloy, molybdenum (Mo), and a molybdenum alloy, or may be made of multiple layers in which metal layers made of any of copper (Cu), a copper alloy, aluminum (Al), an aluminum alloy, titanium (Ti), a titanium alloy, molybdenum (Mo), and a molybdenum alloy are stacked.

The interlayer insulating layer 160 may be disposed on the second gate insulating layer 142 and the second gate metal lines 157 and 156.

The interlayer insulating layer 160 may be made of, for example, a silicon nitride (SiNx) or a silicon oxide (SiOx).

The interlayer insulating layer 160 has contact holes 61, 62, 63, 64, and 66.

The data metal lines 171, 172, 174, 175, and 179, including a data line 171, a driving voltage line 172, a driving connecting member 174, an initialization connecting member 175, and a pixel connecting member 179, may be disposed on the interlayer insulating layer 160.

The data metal lines 171, 172, 174, 175, and 179 may be made of multi-layer in which metal layers including any of copper (Cu), a copper alloy, aluminum (Al), an aluminum alloy, titanium (Ti), a titanium alloy, molybdenum (Mo), and a molybdenum alloy are stacked, and for example, may be made of a triple-layer of titanium/aluminum/titanium (Ti/Al/Ti), a triple-layer of molybdenum/aluminum/molybdenum (Mo/Al/Mo), or a triple-layer of molybdenum/copper/molybdenum (Mo/Cu/Mo).

The data line 171 may be connected to the switching source electrode 136b2 through the contact hole 62 formed in the second gate insulating layer 142 and the interlayer insulating layer 160. One end of the driving connecting member 174 may be connected to the first storage electrode 155a through the contact hole 61 formed in the second gate insulating layer 142 and the interlayer insulating layer 160, and the other end of the driving connecting member 174 may be connected to the compensation drain electrode 137c2 and the initialization drain electrode 137d2 through the contact hole 63 formed in the second gate insulating layer 142 and the interlayer insulating layer 160.

The initialization connecting member 175, which is parallel with the data line 171, may be connected to the initialization source electrode 136d2 through the contact hole 64 formed in both the second gate insulating layer 142 and the interlayer insulating layer 160.

Also, the pixel connecting member 179 may be connected to the light emission drain electrode 137f2 through the contact hole 66 formed in both the second gate insulating layer 142 and the interlayer insulating layer 160.

A passivation layer 180 is formed to cover the data metal lines 171, 172, 174, 175, and 179, and the interlayer insulating layer 160 is disposed thereon.

The passivation layer 180 covering the metal data lines 171, 172, 174, 175, and 179 is flattened, so that the pixel electrode 191 may be formed on the passivation layer 180 without a step. The passivation layer 180 may be made of a stacked layer of an organic material such as, for example, a polyacryl resin, a polyimide resin, or the like, or a stacked layer of an organic material and an inorganic material.

The pixel electrode 191 and the initialization voltage line 192 may be disposed on the passivation layer 180.

The pixel connecting member 179 may be connected to the pixel electrode 191 through the contact hole 81 formed in the passivation layer 180, and the initialization connecting member 175 may be connected to the initialization voltage line 192 through the contact hole 82 formed in the passivation layer 180.

A pixel definition layer (PDL) 350 may be deposited to cover the passivation layer 180, the initialization voltage line 192, and the edge of the pixel electrode 191, in which the pixel definition layer 350 may have a pixel opening 351.

The pixel definition layer 350 may be made of an organic material such as, for example, a polyacryl resin, a polyimide resin, or the like, or a silica-based organic material.

The organic emission layer 370 may be disposed on the pixel electrode 191 which overlaps the pixel opening 351, and the common electrode 270 may be disposed on the organic emission layer 370.

The common electrode 270 may also be disposed on the pixel definition layer 350 over the plurality of pixels PX.

The organic light emitting diode OLED including the pixel electrode 191, the organic emission layer 370, and the common electrode 270 may be formed. Here, the pixel electrode 191 is an anode, i.e., a hole injection electrode, and the common electrode 270 is a cathode, i.e., an electron injection electrode. However, the exemplary embodiment according to the present disclosure is not limited thereto, and the pixel electrode 191 may be the cathode and the common electrode 270 may be the anode.

Holes and electrons are injected into the organic emission layer 370 from the pixel electrode 191 and the common electrode 270, respectively. When excitons generated by combining the injected holes and electrons fall from an excitation state to a ground state, light is emitted from the organic emission layer 370.

The organic emission layer 370 may be made of a low-molecular organic material, or a high-molecular organic material such as poly(3,4-ethylenedioxythiophene) (PEDOT).

Further, the organic emission layer 370 may be formed in a multi-layer, including at least one of an emission layer, a hole injection layer (HIL), a hole transporting layer (Hit), an electron transporting layer (ETL), and an electron injection layer (EIL).

When the organic emission layer 370 include all of the layers, the hole injection layer is disposed on the pixel electrode 191, which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light; and the red organic emission layer, the green organic emission layer, and the blue organic emission layer are formed at a red pixel, a green pixel, and a blue pixel, respectively, to implement color images.

In the organic emission layer 370, all of the red organic emission layer, the green organic emission layer, and the blue organic emission layer are laminated together on the red pixel, the green pixel, and the blue pixel; and a red color filter, a green color filter, and a blue color filter are formed for each pixel to implement the color images.

In an exemplary embodiment of the present disclosure, a white organic emission layer emitting white light is formed on all of the red pixel, the green pixel, and the blue pixel; and the red color filter, the green color filter, and the blue color filter are formed for each pixel to implement the color images.

When the color images are implemented by using the white organic emission layer and the color filters, a deposition mask for respectively depositing the red organic emission layer, the green organic emission layer, and the blue organic emission layer on individual pixels, i.e., the red pixel, the green pixel, and the blue pixel, may not be used.

The white organic emission layer described in the above example may, of course, be formed by one organic emission layer, and it may also include a configuration that may emit white light by laminating a plurality of organic emission layers together to form the white organic emission layer.

In an exemplary embodiment of the present disclosure, the white organic emission layer may include a configuration that enables the white light emission by combining at least one yellow organic emission layer and at least one blue organic emission layer, a configuration that enables the white light emission by combining at least one cyan organic emission layer and at least one red organic emission layer, a configuration that enables the white light emission by combining at least one magenta organic emission layer and at least one green organic emission layer, and the like.

An encapsulation member protecting the organic light emitting diode OLED may be formed on the common electrode 270, and the encapsulation member may be sealed to the substrate 110 by a sealant and may be formed of various materials such as, for example, glass, quartz, ceramic, plastic, and metal. On the other hand, a thin film encapsulation layer may be disposed on the common electrode 270 by depositing the inorganic layer and the organic layer without the usage of the sealant.

Hereinafter, a method for manufacturing an organic light emitting display device according to an exemplary embodiment of the present disclosure will be described with reference to the FIGS. 3, 4, 5, 6, 7, 8, 9, 10, and 11.

Figure 6:
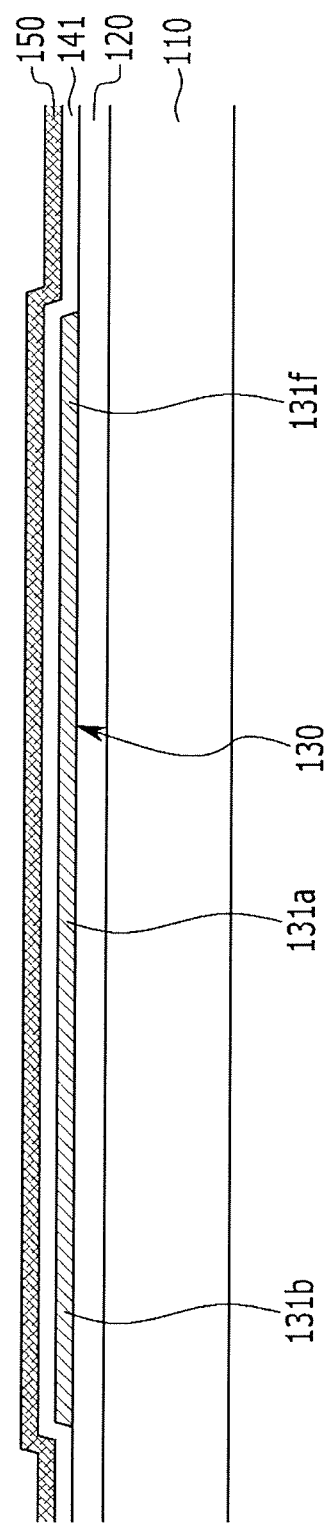
FIG. 6 is a cross-sectional view illustrating one step of a manufacturing method of the organic light emitting diode display according to an exemplary embodiment of the present disclosure, and the cross-sectional view of the organic light emitting diode display of FIG. 3 taken along a position corresponding to the line IV-IV.
Figure 7:
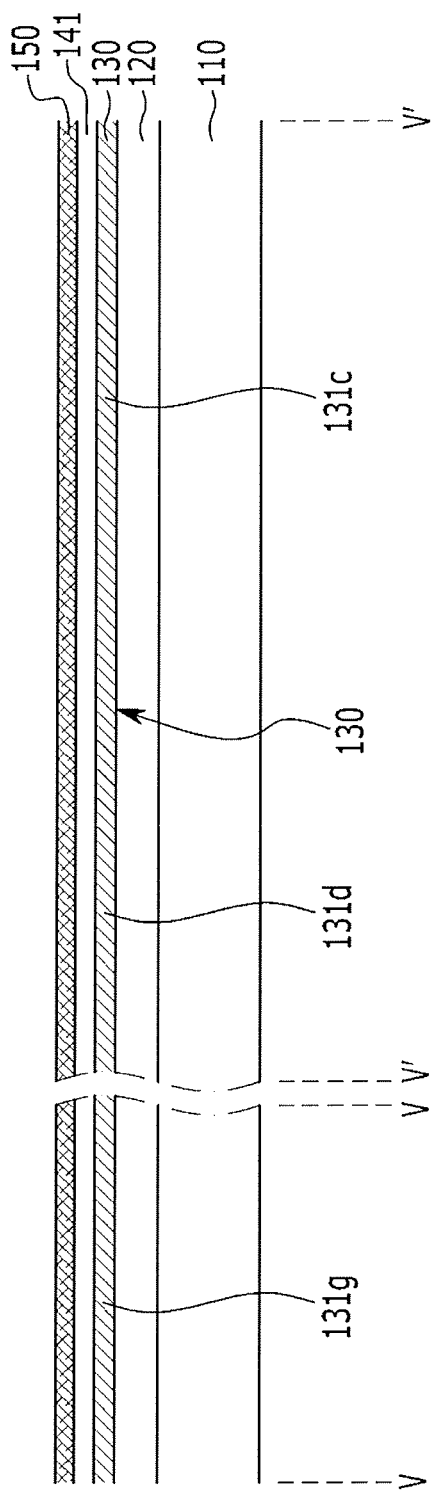
FIG. 7 is a cross-sectional view illustrating the same step as FIG. 6, and the cross-sectional view of the organic light emitting diode display of FIG. 3 taken along a position corresponding to the lines V-V and V'-V'.
Figure 8:
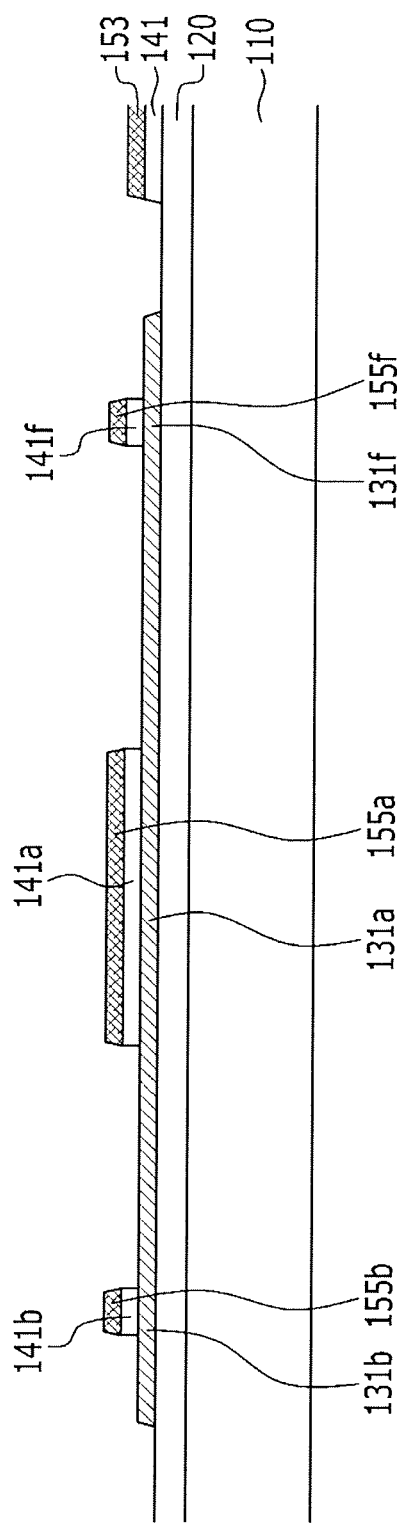
FIG. 8 is a cross-sectional view illustrating a following step of FIG. 6 of the manufacturing method of the organic light emitting diode display according to an exemplary embodiment of the present disclosure.
Figure 9:
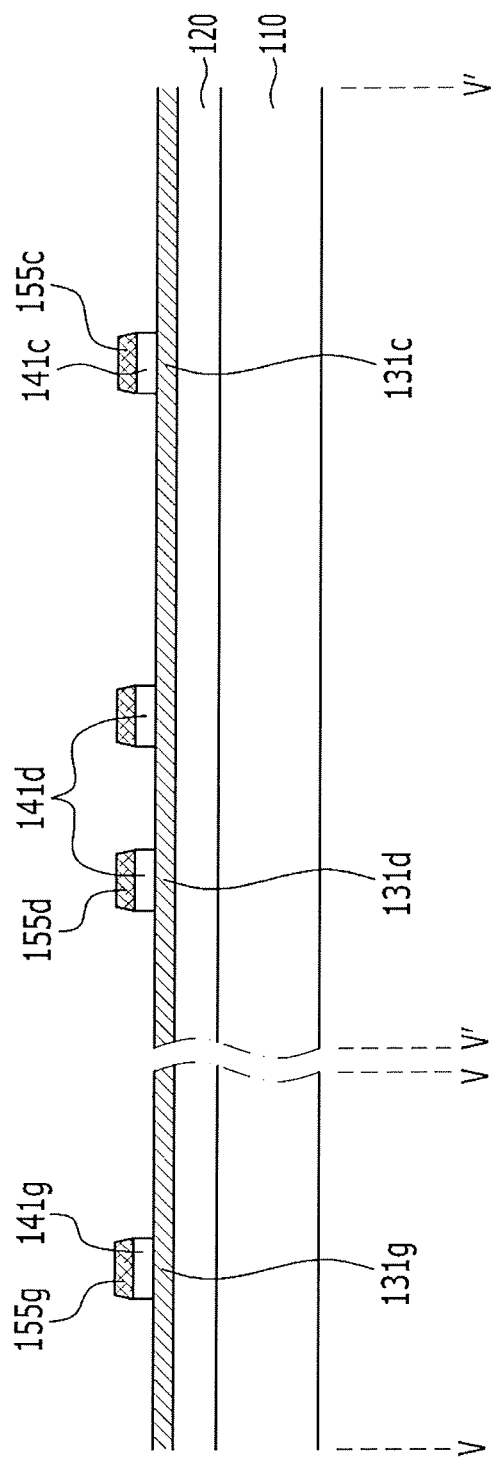
FIG. 9 is a cross-sectional view illustrating the same step as FIG. 8.
Figure 10:
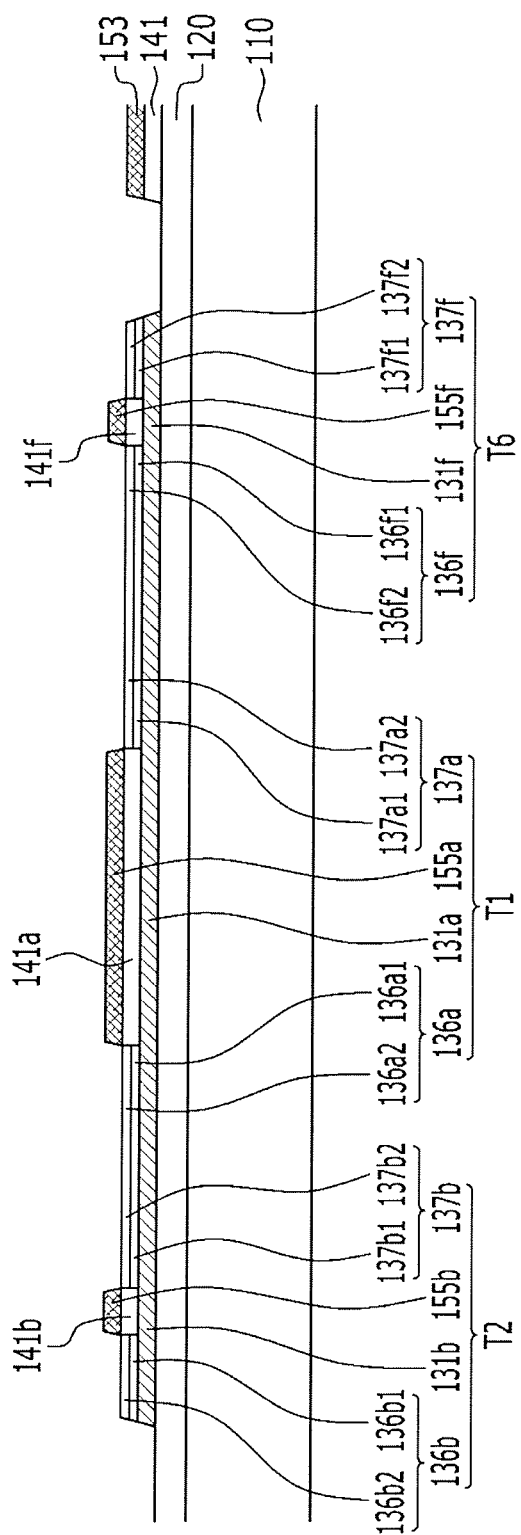
FIG. 10 is a cross-sectional view illustrating a following step of FIG. 8 of the manufacturing method of the organic light emitting diode display according to an exemplary embodiment of the present disclosure.
Figure 11:
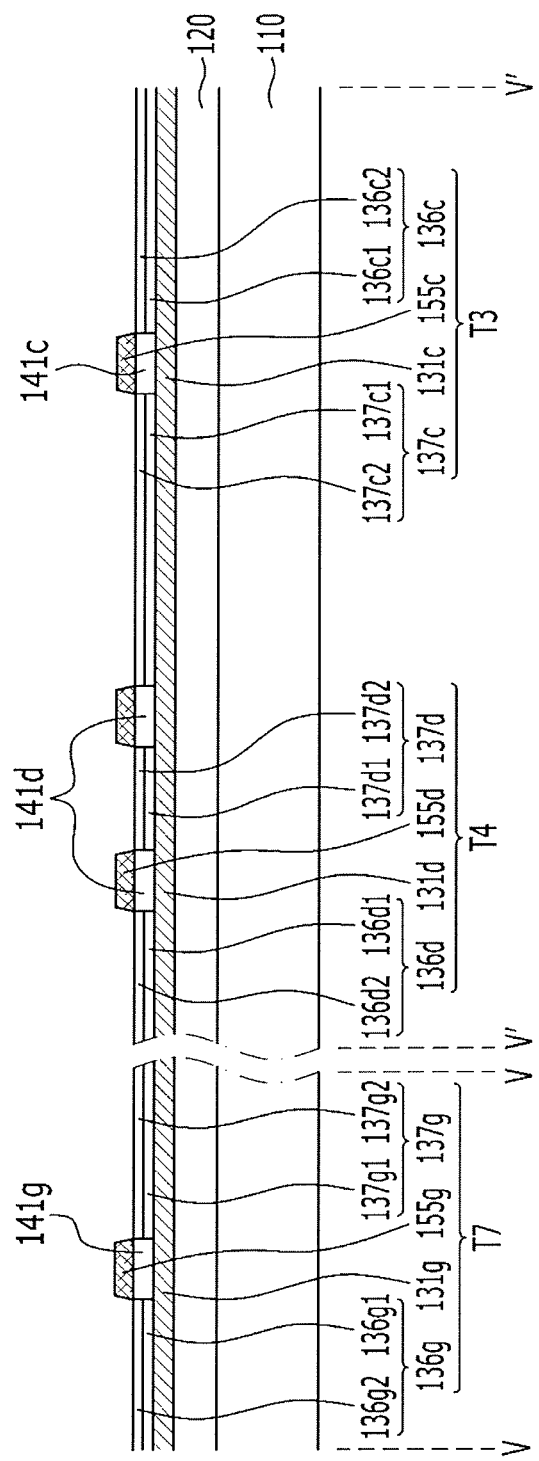
FIG. 11 is a cross-sectional view illustrating the same step as FIG. 10.

FIG. 6 is a cross-sectional view illustrating one step of manufacturing method of the organic light emitting diode display according to an exemplary embodiment of the present disclosure, and the cross-sectional view of the organic light emitting diode display of FIG. 3 taken along a position corresponding to the line IV-IV. FIG. 7 is a cross-sectional view illustrating the same step as FIG. 6, and the cross-sectional view of the organic light emitting diode display of FIG. 3 taken along a position corresponding to the lines V-V and V'-V'. FIG. 8 is a cross-sectional view illustrating a following step of FIG. 6, FIG. 9 is a cross-sectional view illustrating the same step as FIG. 8, FIG. 10 is a cross-sectional view illustrating a following step of FIG. 8, and FIG. 11 is a cross-sectional view illustrating the same step as FIG. 10.

As shown in FIGS. 6 and 7, a buffer layer 120 is formed on a substrate 110.

The buffer layer 120 may be formed as a single layer of a silicon nitride layer or a dual layer structure in which a silicon nitride layer and a silicon oxide layer are laminated, and is deposited on the entire surface of the substrate 110 using a plasma chemical vapor deposition (PECVD) method and the like.

A semiconductor layer 130 is formed on the buffer layer 120. The semiconductor layer 130 may be formed of a polycrystalline semiconductor layer, and the polycrystalline semiconductor layer may be formed by forming an amorphous silicon layer and then crystallizing the amorphous silicon layer.

Various known methods may be applied as a crystallization method, and the amorphous silicon layer may be crystallized using, for example, heat, a laser, Joule heat, an electric field, or a catalyst metal.

At this time, the semiconductor layer is an intrinsic semiconductor which is not doped with an impurity.

By performing a photolithography process using a first mask, the semiconductor layer is formed as the semiconductor member 130 as shown in FIGS. 6 and 7. In this case, the semiconductor member 130 has not yet been doped and thus is not divided into a channel, a source electrode, and a drain electrode for forming each transistor.

The semiconductor member 130 may be doped with a lightly doping concentration, thereby making the semiconductor member 130 an impurity semiconductor. Therefore, a channel 131 of each transistor is formed in the semiconductor member 130. That is, a driving channel 131a, a switching channel 131b, a compensation channel 131c, an initialization channel 131d, an operation control channel 131e, a light emission control channel 131f, and a bypass channel 131g are simultaneously formed on the semiconductor member 130.

A first insulating layer 141 covering the buffer layer 120 and the semiconductor member 130 is formed on the buffer layer 120 and the semiconductor member 130.

The first gate insulating layer 141 is formed by wholly depositing a silicon nitride (SiNx) or a silicon oxide (SiO$_2$) using a PECVD method and the like.

A first gate metal layer 150 is deposited on the first insulating layer 141.

The first gate metal layer 150 may be made of a multilayer of a metal layer including at least one of copper (Cu), a copper alloy, aluminum (Al), and an aluminum alloy, and a metal layer including at least one of titanium (Ti), a titanium alloy, molybdenum (Mo) and a molybdenum alloy.

As shown in FIGS. 3, 8 and 9, the first gate metal layer 150 and the first gate insulating layer 141 are etched through a photolithography process using a second mask. Thus, first gate metal lines 151, 152, 153, and 155a, which include a scan line 151 including a switching gate electrode 155b and a compensation gate electrode 155c, a previous scan line 152 including an initialization gate electrode 155d and a bypass gate electrode 155g, a light emission control line 153 including a light emission control gate electrode 155f, and a first storage electrode 155a which is a driving gate electrode, are formed.

At this time, insulating members 141a, 141b, 141c, 141d, 141f, and 141g are simultaneously formed.

As shown in FIGS. 10 and 11, a first selective epitaxial growth process is performed on the semiconductor member 130.

At this time, a hydrogen radical including an impurity for light doping is deposited to the semiconductor member 130, the impurity for light doping having a doping concentration in a range of about $10^{12}$/cm$^3$ to about $10^{15}$/cm$^3$. In this regard, a weak bond between silicon (Si) and hydrogen (H) of polysilicon layer on the semiconductor member 130 may be removed selectively by a hydrogen radical including a hydrochloric acid (HCl) or hydrogen plasma (H$_2$ plasma), thereby growing a crystalline silicon layer. The gas ratio between the doping impurity gas and the silicon source gas used in depositing silicon and growing the doped epitaxial layer controls the impurity doping concentration in silicon, and may be varied for obtaining different doping concentrations.

First lightly doped epitaxial layers 136a1, 136b1, 136c1, 136d1, 136f1, and 136g1, and second lightly doped epitaxial layers 137a1, 137b1, 137c1, 137d1, 137f1, and 137g1 are formed in an exposed portion of the semiconductor member 130, except a portion blocked by the switching gate electrode 155b, the compensation gate electrode 155c, the initialization gate electrode 155d, the light emission control gate electrode 155f, the bypass gate electrode 155g, and the driving gate electrode 155a in the semiconductor member 130.

The first lightly doped epitaxial layers 136a1, 136b1, 136c1, 136d1, 136f1, and 136g1 and the second lightly doped epitaxial layers 137a1, 137b1, 137c1, 137d1, 137f1, and 137g1 function as the lightly doped drain (LDD).

A second selective epitaxial growth process is performed on the first lightly doped epitaxial layers 136a1, 136b1, 136c1, 136d1, 136f1, and 136g1 and the second lightly doped epitaxial layers 137a1, 137b1, 137c1, 137d1, 137f1, and 137g1.

At this time, a hydrogen radical including a doping impurity having a doping concentration larger than doping concentrations of the first lightly doped epitaxial layer and the second lightly doped epitaxial layer is deposited on the first lightly doped epitaxial layers 136a1, 136b1, 136c1, 136d1, 136f1, and 136g1 and the second lightly doped epitaxial layers 137a1, 137b1, 137c1, 137d1, 137f1, and 137g1.

The hydrogen radical may include a doping impurity having a doping concentration larger than $10^{14}$/cm$^3$.

The first highly doped epitaxial layers 136a2, 136b2, 136c2, 136d2, 136f2, and 136g2 and the second highly doped epitaxial layers 137a2, 137b2, 137c2, 137d2, 137f2, and 137g2 are formed on the first lightly doped epitaxial layers 136a1, 136b1, 136c1, 136d1, 136f1, and 136g1 and the second lightly doped epitaxial layers 137a1, 137b1, 137c1, 137d1, 137f1, and 137g1, respectively.

The first highly doped epitaxial layers 136a2, 136b2, 136c2, 136d2, 136f2, and 136g2 and the second highly doped epitaxial layers 137a2, 137b2, 137c2, 137d2, 137f2, and 137g2 correspond to the source electrodes 136a2, 136b2, 136c2, 136d2, 136f2, and 136g2 and the drain electrodes 137a2, 137b2, 137c2, 137d2, 137f2, and 137g2, respectively.

As described above, a lightly doped region may be formed in a transistor without using a separate mask, thereby simplifying a manufacturing process and reducing manufacturing costs.

Since a lightly doped epitaxial layer and a highly doped epitaxial layer, which have different doping concentrations, are formed by using a selective epitaxial growth process, the highly doped epitaxial layer may function as a source electrode and a drain electrode, and the lightly doped epitaxial layer may function as the lightly doped region. In addition, since the highly doped epitaxial layer functions as the source electrode and the drain electrode, a better contact characteristic of a transistor may be obtained.

One photo-process and two ion implantation processes and activation processes for forming the lightly doped region may be omitted, thereby enhancing process ability by simplifying the manufacturing process and reducing a tact time. In addition, since it is possible to omit the activation process performed at a high temperature process, a low temperature process may allow the selection of a wide range of low heat resistant organic materials. Furthermore, since it is possible to use a low temperature process, a low-priced glass substrate may be used, thereby reducing manufacturing costs and making it possible to use a low resistance wiring.

As shown in FIGS. 3, 4, and 5, the second gate insulating layer 142 is formed to cover the buffer layer 120, the first gate metal lines 151, 152, 153, and 155a, the source electrodes 136a2, 136b2, 136c2, 136d2, 136f2, and 136g2, and the drain electrodes 137a2, 137b2, 137c2, 137d2, 137f2, and 137g2.

The second gate insulating layer 142 is formed by wholly depositing a silicon nitride (SiNx) or a silicon oxide (SiO$_2$) using a PECVD method and the like.

A second gate metal layer is formed on a second gate insulating layer 142. The second gate metal layer may be made of a multi-layer of a metal layer including at least one of copper (Cu), a copper alloy, aluminum (Al), and an aluminum alloy, and a metal layer including at least one of titanium (Ti), a titanium alloy, molybdenum (Mo) and a molybdenum alloy.

The second gate metal layer is etched by using a third mask through a photolithography process. Thus, second gate metal lines 157 and 156, which include a storage line 157 and a second storage electrode 156, are formed.

An interlayer insulating layer 160 is formed to cover the second gate insulating layer 142 and the second gate metal lines 157 and 156.

A plurality of contact holes 61, 62, 63, 64, and 66 are formed by simultaneously etching the second gate insulating layer 142 and the interlayer insulating layer 160 through a photolithography process using a fourth mask.

A data metal layer is formed on the interlayer insulating layer 160. The data metal layer may be formed of a multi-layer of a metal layer including at least one of copper, a copper alloy, aluminum, and an aluminum alloy, and a metal layer including at least one of titanium (Ti), a titanium alloy, molybdenum and a molybdenum alloy. For example, the data metal layer may be formed of a triple-layer of titanium/aluminum/titanium (Ti/Al/Ti) or a triple-layer of molybdenum/copper/molybdenum (Mo/Cu/Mo).

The data metal layer is etched through a photolithography process using a fifth mask. Thus, data metal lines 171, 172, 174, and 179 including a data line 171, a driving voltage line 172, a driving connecting member 174, and a pixel connecting member 179 are formed on the interlayer insulating layer 160.

A passivation layer 180 is formed to cover the interlayer insulating layer 160 and the data metal lines 171, 172, 174, and 179, and a contact hole 81 is formed in the passivation layer 180 through a photolithography process using a sixth mask.

A pixel electrode layer is formed on the passivation layer 180, and the pixel electrode layer is etched through a photolithography process using a seventh mask. Thus, a pixel electrode 191, which is connected to the pixel connecting member 179 through the contact hole 81, is formed.

A pixel definition layer 350 covering the pixel electrode 191 is formed on the passivation layer 180, and a pixel opening 351 that mostly overlaps the pixel electrode 191 is formed in the pixel definition layer 350 using an eighth mask.

An organic emission layer 370 is formed on the pixel electrode 191 overlapping the pixel opening 351 of the pixel definition layer 350. Then, a common electrode 270 may be formed on the organic emission layer 370 such that an organic light emitting diode OLED is formed.

The common electrode 270 may be formed throughout the entire area including the pixel definition layer 350, so that no separate mask is used.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the present invention as defined by the appended claims.

What is claimed is:

1. An organic light emitting diode (OLED) display comprising:
   a substrate;
   a transistor on the substrate; and
   an organic light emitting diode (OLED) connected to the transistor,
   wherein the transistor includes:
   a semiconductor member on the substrate,
   an insulating member on the semiconductor member,
   a source member and a drain member disposed on the semiconductor member and respectively disposed at opposite sides of the insulating member, and
   a gate electrode on the insulating member,
   wherein each of the source member and the drain member includes a plurality of layers having different impurity doping concentrations.

2. The OLED display of claim 1, wherein
   the source member includes a plurality of first doped epitaxial layers and the drain member includes a plurality of second doped epitaxial layers.

3. The OLED display of claim 2, wherein
   the plurality of first doped epitaxial layers include a first lightly doped epitaxial layer which contacts the semiconductor member and a first highly doped epitaxial layer disposed on the first lightly doped epitaxial layer, and
   the plurality of second doped epitaxial layers include a second lightly doped epitaxial layer which contacts the semiconductor member and a second highly doped epitaxial layer disposed on the second lightly doped epitaxial layer.

4. The OLED display of claim 2, wherein
   the semiconductor member includes a polysilicon layer, and
   each of the plurality of first doped epitaxial layers and each of the plurality of second doped epitaxial layers include a crystalline silicon layer which includes a doping impurity.

5. The OLED display of claim 1, wherein
   the insulating member overlaps the gate electrode.

6. The OLED display of claim 1, wherein
   a side boundary line of the insulating member corresponds to a side boundary line of the gate electrode.

7. The OLED display of claim 6, wherein
   the semiconductor member includes a first semiconductor region which overlaps the gate electrode and a second semiconductor region which does not overlap the gate electrode, and
   the source member and the drain member overlap the second semiconductor region.

8. The OLED display of claim 1, wherein
   the semiconductor member extends to overlap the transistor.

9. The OLED display of claim 8, further comprising:
   a scan line disposed on the substrate and transmitting a scan signal; and
   a data line and a driving voltage line which cross the scan line and transmit a data signal and a driving voltage, respectively,
   wherein the transistor includes a switching transistor and a driving transistor, the switching transistor connected to the scan line and the data line, and the driving transistor connected to the switching transistor and including a driving gate electrode and a driving semiconductor member which overlaps the driving gate electrode and is curved in a plane view.

10. A manufacturing method of an organic light emitting diode (OLED) display comprising:
    forming a transistor on a substrate; and forming an organic light emitting diode connected to the transistor, wherein the forming of the transistor includes:

forming a semiconductor member on the substrate, forming an insulating layer sequentially covering the semiconductor member and a gate metal layer covering the insulating layer, forming a gate electrode and an insulating member by simultaneously etching the gate metal layer and the insulating layer, and forming a source member and a drain member on the semiconductor member, and wherein the source member and the drain member are disposed at opposite sides of the insulating member, and each includes a plurality of layers having different impurity doping concentrations.

11. The manufacturing method of the OLED display of claim 10, wherein the forming of the source member and the drain member includes:

forming a first lightly doped epitaxial layer and a second lightly doped epitaxial layer on the semiconductor member; and forming a first highly doped epitaxial layer and a second highly doped epitaxial layer on the first lightly doped epitaxial layer and the second lightly doped epitaxial layer, respectively.

12. The manufacturing method of the OLED display of claim 11, wherein the forming of the first lightly doped epitaxial layer and the second lightly doped epitaxial layer includes depositing a hydrogen radical including a doping impurity on the semiconductor member.

13. The manufacturing method of the OLED display of claim 12, wherein the forming of the first highly doped epitaxial layer and the second highly doped epitaxial layer includes depositing a hydrogen radical including a doping impurity having a doping concentration larger than a doping concentration of the first lightly doped epitaxial layer and the second lightly doped epitaxial layer on the first lightly doped epitaxial layer and the second lightly doped epitaxial layer.

14. The manufacturing method of the OLED display of claim 13, wherein the doping concentration of the first lightly doped epitaxial layer and the second lightly doped epitaxial layer is in a range of about $10^{12}/cm^3$ to about $10^{15}/cm^3$.

15. The manufacturing method of the OLED display of claim 13, wherein the doping concentration of the first highly doped epitaxial layer and the second highly doped epitaxial layer is larger than $10^{14}/cm^3$.

16. The manufacturing method of the OLED display of claim 10, wherein before the forming of the semiconductor member on the substrate, the manufacturing method further comprises forming a buffer layer on the substrate, the buffer layer includes a single silicon nitride layer or a dual layer with a silicon nitride layer over a silicon oxide layer.

17. A manufacturing method of an organic light emitting diode (OLED) display comprising:

forming a plurality of transistors, and a capacitor connected to at least one of the plurality of transistors on a substrate; and forming an organic light emitting diode connected to at least one of the plurality of transistors, wherein the forming of the plurality of transistors, at least forming one of the plurality of transistors includes:

forming a buffer layer on the substrate, forming a semiconductor member on the buffer layer, forming an insulating layer covering the semiconductor member and a gate metal layer covering the insulating layer, forming a gate electrode and an insulating member by simultaneously etching the gate metal layer and the insulating layer, and forming a source member and a drain member through a selective epitaxial growth process on the semiconductor member at opposite sides of the insulating member, wherein the source member and the drain member each includes a plurality of layers having different impurity doping concentrations.

18. The manufacturing method of the OLED display of claim 17, wherein the selective epitaxial growth process includes a first selective epitaxial growth process and a second selective epitaxial growth process, and the forming of the source member and the drain member includes:

forming a first lightly doped epitaxial layer and a second lightly doped epitaxial layer through the first selective epitaxial growth process on the semiconductor member; and forming a first highly doped epitaxial layer and a second highly doped epitaxial layer through the second selective epitaxial growth process on the first lightly doped epitaxial layer and the second lightly doped epitaxial layer, respectively, wherein the source member includes the first lightly and the first highly doped epitaxial layers, and the drain member includes the second lightly and the second highly doped epitaxial layers.

19. The manufacturing method of the OLED display of claim 18, wherein the first selective epitaxial growth process includes depositing silicon, hydrogen radical and a doping impurity on the semiconductor member to form the first lightly doped epitaxial layer and the second lightly doped epitaxial layer having a first doping concentration, and the second selective epitaxial growth process includes depositing silicon, hydrogen radical and the doping impurity to form the first highly doped epitaxial layer and the second highly doped epitaxial layer having a second doping concentration which is larger than the first doping concentration on the first lightly doped epitaxial layer and the second lightly doped epitaxial layer, respectively.

20. The manufacturing method of the OLED display of claim 19, wherein the first doping concentration is in a range of about $10^{12}/cm^3$ to about $10^{15}/cm^3$, and the second doping concentration is larger than $10^{14}/cm^3$.

* * * * *